US006995445B2

(12) United States Patent
Forrest et al.

(10) Patent No.: US 6,995,445 B2
(45) Date of Patent: Feb. 7, 2006

(54) THIN FILM ORGANIC POSITION SENSITIVE DETECTORS

(75) Inventors: Stephen R. Forrest, Princeton, NJ (US); Barry P. Rand, Princeton, NJ (US); Michael J. Lange, Newtown, PA (US)

(73) Assignee: The Trustees of Princeton University, Princeton, NJ (US)

(*) Notice: Subject to any disclaimer, the term of this patent is extended or adjusted under 35 U.S.C. 154(b) by 0 days.

(21) Appl. No.: 10/607,211

(22) Filed: Jun. 25, 2003

(65) Prior Publication Data

US 2004/0178325 A1   Sep. 16, 2004

Related U.S. Application Data

(60) Provisional application No. 60/454,836, filed on Mar. 14, 2003.

(51) Int. Cl.
*H01L 31/00* (2006.01)
(52) U.S. Cl. .................. 257/448; 257/40; 257/431; 257/432
(58) Field of Classification Search ............. 257/40, 257/431, 432, 448; 438/82, 99; 313/503, 313/504, 506
See application file for complete search history.

(56) References Cited

U.S. PATENT DOCUMENTS

| | | | |
|---|---|---|---|
| 4,788,082 A | | 11/1988 | Schmitt |
| 5,006,915 A | * | 4/1991 | Yoshikawa et al. ............ 257/40 |
| 5,104,749 A | * | 4/1992 | Sato et al. .................. 428/690 |
| 5,247,190 A | | 9/1993 | Friend et al. |
| 5,256,205 A | | 10/1993 | Schmitt, III et al. |
| 5,514,878 A | * | 5/1996 | Holmes et al. ............... 257/40 |
| 5,540,999 A | * | 7/1996 | Yamamoto et al. ......... 428/411.1 |
| 5,650,197 A | | 7/1997 | Halpern |
| 5,663,573 A | * | 9/1997 | Epstein et al. ................ 257/40 |
| 5,674,597 A | * | 10/1997 | Fujii et al. .................. 428/212 |

(Continued)

OTHER PUBLICATIONS

Torkel Wallmark et al., "A New Semiconductor Photocell Using Lateral Photoeffect", Proc. Ire vol. 45, No. 1, Pp. 474-483 (1957).

(Continued)

*Primary Examiner*—George Eckert
*Assistant Examiner*—Edgardo Ortiz
(74) *Attorney, Agent, or Firm*—Kenyon & Kenyon

(57) ABSTRACT

The present invention is directed to organic photosensitive optoelectronic devices and methods of use for determining the position of a light source. Provided is an organic position sensitive detector (OPSD) comprising: a first electrode, which is resistive and may be either an anode or a cathode; a first contact in electrical contact with the first electrode; a second contact in electrical contact with the first electrode; a second electrode disposed near the first electrode; a donor semiconductive organic layer disposed between the first electrode and the second electrode; and an acceptor semiconductive organic layer disposed between the first electrode and the second electrode and adjacent to the donor semiconductive organic layer. A hetero-junction is located between the donor layer and the acceptor layer, and at least one of the donor layer and the acceptor layer is light absorbing. The OPSD has an optical beam spatial resolution of 20 μm and measurements are insensitive to fluctuations in incident light beam intensity and background illumination. The response of the OPSD shows high linearity, low positional error, high spatial resolution, and good beam tracking velocity. The OPSDs exhibited linearities and positional uncertainties of <1%.

38 Claims, 8 Drawing Sheets

U.S. PATENT DOCUMENTS

| | | | |
|---|---|---|---|
| 5,703,436 A | 12/1997 | Forrest et al. | |
| 5,707,745 A | 1/1998 | Forrest et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,097,147 A | 8/2000 | Baldo et al. | |
| 6,294,398 B1 | 9/2001 | Kim et al. | |
| 6,337,102 B1 | 1/2002 | Forrest et al. | |
| 6,451,415 B1 | 9/2002 | Forrest et al. | |
| 6,468,819 B1 | 10/2002 | Kim et al. | |
| 6,528,940 B1 * | 3/2003 | Okada et al. | 313/505 |
| 6,670,213 B2 * | 12/2003 | Halls et al. | 438/52 |
| 6,677,060 B2 * | 1/2004 | Li et al. | 428/690 |
| 6,723,445 B2 * | 4/2004 | Li et al. | 428/490 |
| 2002/0074935 A1 * | 6/2002 | Kwong et al. | 313/504 |
| 2003/0007736 A1 * | 1/2003 | Harada | 385/49 |
| 2003/0230980 A1 | 12/2003 | Forrest et al. | |

OTHER PUBLICATIONS

Jasmin Henry et al., "Thin-film Amorphous Silicon Position-sensitive Detectors", Adv. Funct. Mater., vol. 13, No. 12-13 (2001).

Kenji Fukuzawa, "Motion-sensitive Position Sensor Using Bacteriorhodopsin", Applied Optics, vol. 33, No. 31 Pp. 7489-7495 (1994).

Peumans et al. "Very-high-efficiency Double-heterostructure Copper Phthalocyanine/$c_{60}$ Photovoltaic Cells", Applied Physics Letters, vol. 79, No. 1, Pp. 126-128 (2001).

Satoshi Arimoto et al., "Hydrogenated Amorphous Silicon Position Sensitive Detector", Applied Physics Letters, vol. 57, No. 10 Pp. 4778-4782 (1985).

Peumans et al., "Efficient, High-bandwidth Organic Multilayer Photodetectors", Applied Physics Letters, vol. 76, No. 26, Pp. 3855-3857 (2000).

Peumans et al., "Efficient Photon Harvesting at High Optical Intensities in Ultrathin Organic Double-heterostructure Photovoltaic Diodes", Applied Physics Letters, vol. 76, No. 19, Pp. 2650-2652 (2000).

Tang., "Two Layer Organic Photovoltaic Cell" , Applied Physics Letters, vol. 48, No. 2, Pp. 183-185 (1986).

Burrows et al., "Relationship Between Electroluminescence and Current Transport in Organic Heterojunction Light-emitting Devices", Applied Physics Letters, vol. 79, No. 79, No. 10, Pp. 7991-8006 (1996).

Fortunato et al., "Large-area Id Thin-film Position-sensitive Detector with High Detection Resolution", Sensor Actuant A: Phys. vol. 51, No. 2-3, Pp. 135-142 (Feb. 1996).

Forrest, "Ultrathin Organic Films Growth by Organic Molecular Beam Deposition and Related Techniques", Chemical Reviews, vol. 97, No. 6.

Arbour et al., "Surface Chemisties and Photoelectrochemistries of Thin Film Molecular Semiconductor Material", Molecular Crystals and Liquid Crystals, 1990, 183, 307.

Peumans et al., "Small Molecular Weight Organic Thin-Film Photodetectors and Solar Cells," J. Appl. Phys., vol. 93, No. 7, Pp. (2003).

Eres, "High-speed Epitaxy Using Supersonic Molecular Jets," Mal. Res. Soc. Symp. Proc. vol. 201 (1991).

Eres, "Application of Supersonic Molecular Jets in Semiconductor Thin Film Growth," Critical Review in Solid State and Materials Sciences, 23(4):275-322 (1998).

Halpern et al., "Multiple Jets and Moving Substrates: Jet Vapor Deposition of Multicomponent Thin Films," J. Vac. Sci, Technol. A 12(4), Jul./Aug. 1994.

Lubben et al., "Growth and Doping of Si Layers by Molecular-jet Chemical Vapor Deposition Device Fabrication," Appl. Phys. Lett. 71 (19), Nov. 10, 1997.

Rebrov "Free Jets in Vacuum Technologies," J. Vac. Sci. Technol. A 19(4), Jul./Aug. 2001.

De La Mora, "Surface Impact of Seeded Jets at Relatively Large Background Densities," J. Chem. Phys. 82(7), Apr. 1, 1985.

De La Mora et al., "Aerodynamic Focusing of Heavy Molecules in Seeded Supersonic Jets," J. Chem. Phys. 91(4), Aug. 15, 1989.

Vasenkov et al., "Flow-field Properties under Deposition of Films from Low-density Jets," J. Appl. Phys. 77 (9), May 1, 1995.

Vasenkov et al., "Monte Carlo Simulation of an Amorphous Hydrogenated Silicon Film Deposition from a Gas Jet Activated by an Electron Beam," Journal of Applied Physics, vol. 83, No. 7, Apr. 1, 1998.

Mueller, "Role of Incident Kinetic Energy of Adatoms in Thin Films Growth," Surface Science 184 (1987) L375-1382.

Lebedev et al., "Simple Self-Selective Method of Velocity Measurement for Particles in Impact-based Deposition," J. Vac. Sci. Technol. A 18(2), Mar./Apr. 2000.

U.S. Appl. No. 09/931,948, filed Aug. 20, 2001, Lu et al.
U.S. Appl. No. 10/233,470, filed Sep. 4, 2002, Shtein et al.
U.S. Appl. No. 09/311,126, filed May, 13, 1999, Thompson et al.

* cited by examiner

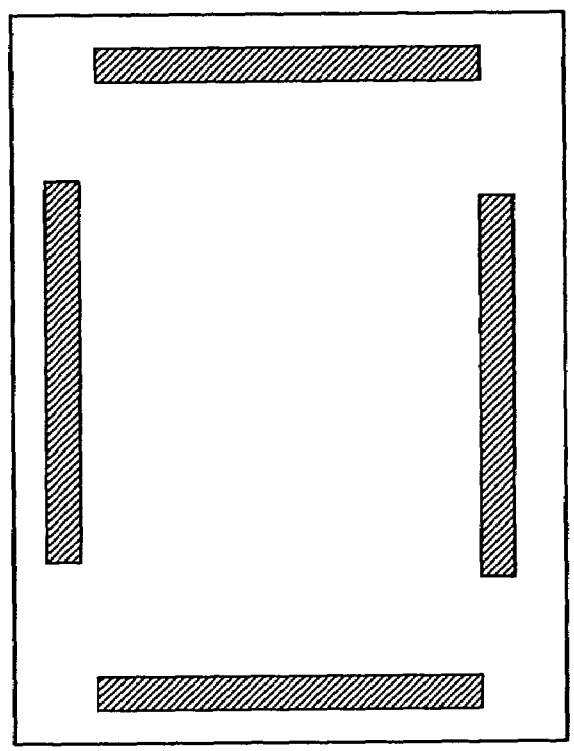
FIG. 2A.   FIG. 2B.
FIG. 2

THIN FILM ORGANIC POSITION SENSITIVE DETECTORS

This application claims priority to Provisional Patent Application Serial No. 60/454,836 filed Mar. 14, 2003, herein incorporated by reference.

GOVERNMENT RIGHTS

This invention was made with Government support under Contract No. F49620-00-1-0065 awarded by Air Force Office of Scientific Research. The government has certain rights in this invention.

RESEARCH AGREEMENTS

The claimed invention was made by, on behalf of, and/or connection with one or more of the following parties to a joint university-corporation research agreement: Princeton University, The University of Southern California, and Universal Display Corporation. The agreement was in effect on and before the date the claimed invention was made, and the claimed invention was made as a result of activities undertaken within the scope of the agreement.

FIELD OF THE INVENTION

The present invention relates to position sensitive detectors and more particularly to organic thin film photosensitive optoelectronic devices used as a high-resolution position sensitive detector.

BACKGROUND OF THE INVENTION

Optoelectronic devices rely on the optical and electronic properties of materials to either produce or detect electromagnetic radiation electronically or to generate electricity from ambient electromagnetic radiation. Photosensitive optoelectronic devices convert electromagnetic radiation into electricity. Solar cells, also known as photovoltaic (PV) devices, are specifically used to generate electrical power. PV devices are used to drive power-consuming loads to provide, for example, lighting, heating, or to operate electronic equipment such as computers or remote monitoring or communications equipment. These power generation applications also often involve the charging of batteries or other energy storage devices so that equipment operation may continue when direct illumination from the sun or other ambient light sources is not available. As used herein the term "resistive load" refers to any power consuming or storing device, equipment or system.

Traditionally, photosensitive optoelectronic devices have been constructed of a number of inorganic semiconductors, e.g. crystalline, polycrystalline and amorphous silicon, gallium arsenide, cadmium telluride and others. Herein the term "semiconductor" denotes materials that can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation of selected spectral energies to generate electric charge carriers. Solar cells are characterized by the efficiency with which they can convert incident solar power to useful electric power. Devices utilizing crystalline or amorphous silicon dominate commercial applications and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. Present commercially available amorphous silicon cells have stabilized efficiencies between 4 and 8%.

Recently, organic materials have attracted considerable interest for use in photovoltaic cells and photodetectors. (C. W. Tang, "Two-layer organic photovoltaic cell," Appl. Phys. Lett., vol. 48, no. 2, pp. 183–185, January 1986; P. Peumans and S. R. Forrest, "Very-high-efficiency double-heterostructure copper phthalocyanine/$C_{60}$ photovoltaic cells," Appl. Phys. Lett., vol. 79, no. 1, pp. 126–128, July 2001; P. Peumans, V. Bulovic, and S. R. Forrest, "Efficient, high-bandwidth organic multilayer photodetectors," Appl. Phys. Lett., vol. 76, no. 26, pp. 3855–3857, June 2000, each of which are herein incorporated by reference.)

The ability to make large area, ultrathin devices due to a small optical absorption length of ~500 Å in the visible spectrum and the ability to obtain acceptable photovoltaic conversion efficiencies with economical production costs are among many reasons for interest in these devices. In addition, their compatibility with rugged, conformable, or flexible substrates opens up many applications that cannot be addressed using other conventional detector technologies. A typical known photovoltaic device configuration is the organic bilayer cell. In the bilayer cell, charge separation predominately occurs at the organic hetero-junction. The built-in potential is determined by the HOMO-LUMO energy levels for such a hetero-junctions produce a gap offset between the donor and acceptor layers and produce an electric field around the donor/acceptor interface.

Position sensitive detectors (PSDs) are an important class of photodetectors that use the lateral photoeffect to detect the position of a focused incident light beam. (J. T. Wallmark, "A new semiconductor photocell using lateral photoeffect," Proc. IRE, vol. 45, no. 4, pp. 474–483, April 1957.) Position sensitive detectors are commonly used in robotic vision, machine tool alignment, and guidance system applications.

PSDs are commonly configured as photodetector arrays fabricated from silicon. A disadvantage of this configuration is the inability to continuously detect a signal without their resolution being limited by detector size. This problem can be overcome by configuring a thin film one dimensional PSD, which has the further advantage of requiring only two outputs, whereas arrays require data output from each detector.

Hydrogenated amorphous silicon (a-Si:H) films have been widely studied for use in large-area PSDs. (S. Arimoto, H. Yamamoto, H. Ohno, and H. Hasegawa, "Hydrogenated amorphous silicon position sensitive detector," J. Appl. Phys., vol. 57, no. 10, pp. 4778–4782, May 1985; E. Fortunato, G. Lavareda, R. Martins, F. Soares, and L. Fernandes, "Large-area 1 D thin-film position-sensitive detector with high detection resolution," Sensor Actuat. A: Phys., vol. 51, no. 2–3, pp. 135–142, February 1996; J. Henry and J. Livingstone, "Thin-film amorphous silicon position-sensitive detectors," Adv. Mater., vol. 13, no. 12–13, pp. 1023–1026, July 2001.)

The a-Si:H films are advantageous over previously used crystalline silicon since they can be made at lower cost and with higher surface area than the crystalline PSDs, however, the size limitation and fabrication cost of a-Si:H films still substantially limits the usefulness of silicon-based PSDs.

A biological substrate, bacteriorhodopsin, has been used to create a motion sensitive detector which can measure the position of a moving light stripe over a film of a protein treated with a high-pH buffer by changes in the photocurrent response. (K. Fukuzawa "Motion-sensitive position sensor using bacteriorhodopsin" Applied Optics vol. 33 no. 31, pp. 7489–7495, November 1994.)

However, this device is limited to having a single biological material that must be buffered with a high pH, and has a low spatial resolution (approximately ±1 mm error) which decreases with increased width of the detector which make this device unusable for many applications.

The advantage of using organic thin film PSDs over those fabricated from photodetector arrays is the ability to continuously detect a signal without their resolution being limited by detector size. Furthermore, a thin film one-dimensional PSD requires only two outputs, whereas arrays require data output from each detector.

Therefore, it would be advantageous to provide an organic hetero-junction PSD (OPSD) with performance equal or superior to that found in many a-Si:H detectors, that can be produced as either a one dimensional PSD or a two dimensional PSD. This PSD would have a high operational bandwidth capable of tracking rapidly scanned optical beams, a resolution substantially similar to or better than the silicon-based detectors, and be produced more economically than existing PSDs.

SUMMARY OF THE INVENTION

The present invention is directed to organic photosensitive optoelectronic devices and methods of use for determining the position of a light source. Therefore, it is an object of the present invention to provide an organic position sensitive detector comprising: a first electrode, which is resistive and may be either an anode or a cathode; a first contact in electrical contact with the first electrode; a second contact in electrical contact with the first electrode; a second electrode disposed near the first electrode; a donor semiconductive organic layer disposed between the first electrode and the second electrode; and an acceptor semiconductive organic layer disposed between the first electrode and the second electrode and adjacent to the donor semiconductive organic layer. A hetero-junction is located between the donor layer and the acceptor layer, and at least one of the donor layer and the acceptor layer is light absorbing.

More specifically, it is an object of the present invention to provide a OPSD where the donor semiconductive organic layer comprises copper phthalocyanine (CuPc) and the acceptor semiconductive organic layer comprises 3,4,9,10-perylenetetra-carboxylic-bis-benzimidazole (PTCBI). It is a still more specific object of the present invention to provide an OPSD with an exciton-blocking layer that may comprise 2,9-dimethyl-4,7-diphenyl-1, 10-phenanthroline (BCP). The OPSD may comprise a polymer layer such as a 3,4-poly-ethylenedioxythiophene:polystyrenesulfonate (PEDOT: PSS) layer. In a preferred embodiment, the OPSD has an optical beam spatial resolution of less than 50 $\mu$m, 30 $\mu$m, or more preferably 20 $\mu$m.

Yet another object of the current invention is to provide a method of determining the position of incident radiation comprising: obtaining an OPSD such as the OPSD described hereinabove, placing the OPSD in the path of the incident radiation; and measuring a current at the first contact and a current at the second contact, wherein the currents are used to determine the position of the incident radiation.

BRIEF DESCRIPTION OF THE DRAWINGS

The foregoing and other features of the present invention will be more readily apparent from the following detailed description of exemplary embodiments taken in conjunction with the attached drawings. It will be noted that for convenience all illustrations of devices show the height dimension exaggerated in relation to the width.

FIGS. 2A and 2B provides a cutaway drawing of the resistive electrode and electrode contacts for a 1D (FIG. 2A) and a 2D (FIG. 2B) electrode.

DETAILED DESCRIPTION OF THE INVENTION

Figure 1:
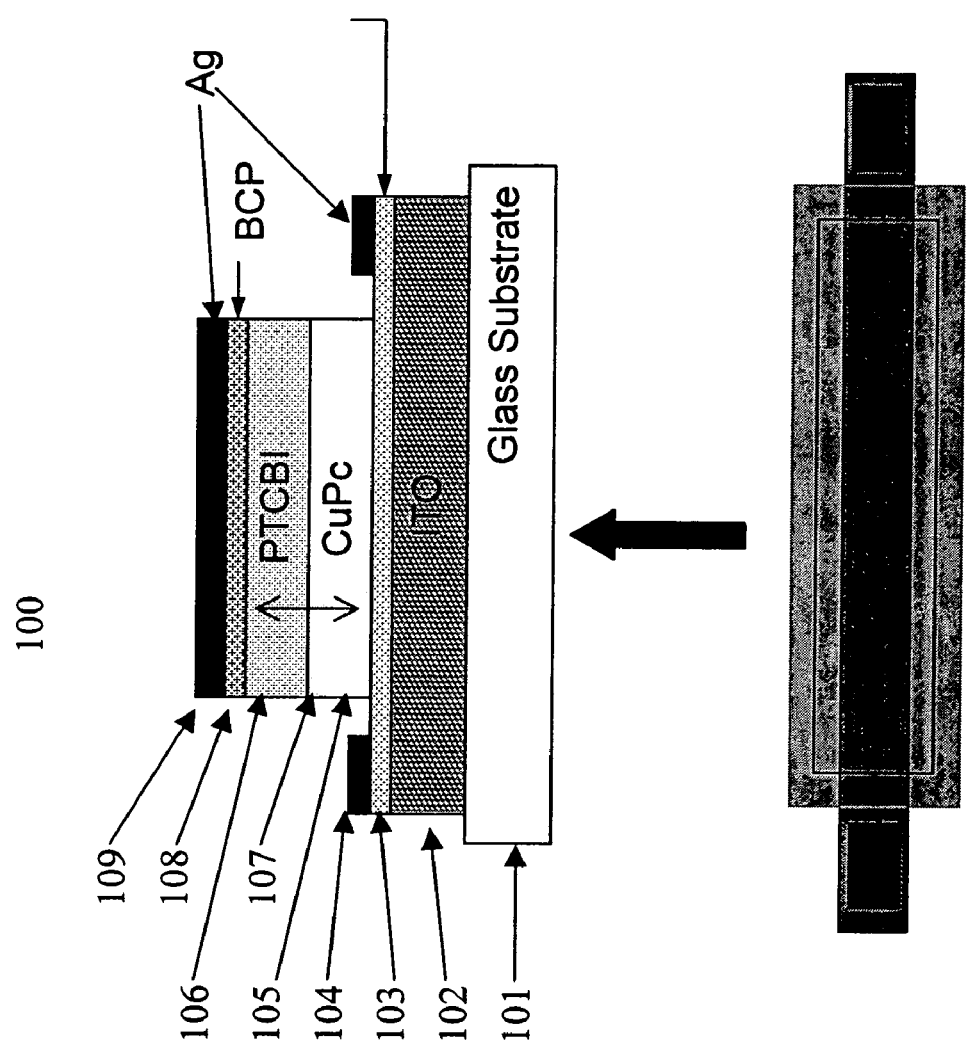
FIG. 1 is a schematic drawing of the OPSD providing a cross-section of the OPSD illustrating the different layers and the location of the incident light beam.

Photovoltaic devices typically have the property that when they are connected across a load and are irradiated by light they produce a photogenerated voltage. When irradiated without any external electronic load, a PV device generates its maximum possible voltage, V open-circuit, or $V_{OC}$. If a PV device is irradiated with its electrical contacts shorted, a maximum short-circuit current, or $I_{SC}$, is produced. When actually used to generate power, a PV device is connected to a finite resistive load and the power output is given by the current voltage product, I×V. The maximum total power generated by a PV device is inherently incapable of exceeding the product, $I_{SC} \times V_{OC}$. When the load value is optimized for maximum power extraction, the current and voltage have values, $I_{max}$ and $V_{max}$ respectively. A figure of merit for solar cells is the fill factor ff defined as:

$$ff = \frac{I_{max} V_{max}}{I_{SC} V_{OC}} \qquad (1)$$

where ff is always less than 1 since in actual use $I_{SC}$ and $V_{OC}$ are never obtained simultaneously. Nonetheless, as ff approaches 1, the device is more efficient.

When electromagnetic radiation of an appropriate energy is incident upon a semiconductive organic material, for example, an organic molecular crystal (OMC) material, or a polymer, a photon can be absorbed to produce an excited molecular state. This is represented symbolically as $S_0+h\nu*S_0*$. Here $S_0$ and $S_0*$ denote ground and excited molecular states, respectively. This energy absorption is associated with the promotion of an electron from a bound state in the valence band, which may be a *-bond, to the conduction band, which may be a **-bond, or equivalently, the promotion of a hole from the conduction band to the valence band. In organic thin-film photoconductors, the generated molecular state is generally believed to be an exciton, i.e., an electron-hole pair in a bound state that is transported as a quasi-particle. The excitons can have an appreciable lifetime before geminate recombination, which refers to the process of the original electron and hole recombining with each other as opposed to recombination with holes or electrons from other pairs. To produce a photocurrent the electron-hole pair must become separated. If the charges do not separate, they can recombine in a geminate recombination process, either radiatively—re-emitting light of a lower than incident light energy—, or non-radiatively—with the production of heat.

Either of these outcomes is undesirable in a photosensitive optoelectronic device. While exciton ionization, or dissociation, is not completely understood, it is generally believed to occur in regions of electric field occurring at defects, impurities, contacts, interfaces or other inhomogeneities. Frequently, the ionization occurs in the electric field induced around a crystal defect, denoted, M. This reaction is denoted $S_0*+M*e-+h^+$. If the ionization occurs at a random defect in a region of material without an overall electric field, the generated electron-hole pair will likely recombine.

To achieve a useful photocurrent, the electron and hole must be collected separately at respective opposing electrodes, which are frequently referred to as contacts. Exciton dissociation occurs either in high electric field regions by field-emission, or at an interface between, e.g., donor-like and acceptor-like materials such as copper phthalocyanine (CuPc) and 3,4,9,10-perylenetetracarboxylic-bis-benzimidazole (PTCBI), by charge transfer. The latter can be viewed as an exothermic chemical reaction, i.e., a reaction in which some energy is released as vibrational energy. This reaction occurs because the energy separation of the dissociated exciton, i.e., the energy difference between the free electron in, e.g., PTCBI, and the free hole in, e.g., CuPc, is smaller than the energy of the exciton prior to dissociation.

Electric fields or inhomogeneities at a contact may cause an exciton to quench rather than dissociate, resulting in no net contribution to the current. Therefore, it is desirable to keep photogenerated excitons away from the contacts. This has the effect of limiting the diffusion of excitons to the region near the hetero-junction so that the junction-associated electric field has an increased opportunity to separate charge carriers liberated by the dissociation of the excitons near the hetero-junction.

Here appreciation should be taken of some of the distinctions between organic photosensitive optoelectronic devices (OPODs) and organic light emitting devices (OLEDs). In an OLED, a bias is applied to a device to produce a flow of holes and electrons into a device. In OLEDs, excitons are generally formed which in time may either recombine radiatively or nonradiatively. In OLEDs, maximum radiative recombination is the desired result. In OPODs maximum exciton generation and dissociation is the desired result. The differing objectives of the devices lead to differing selection of materials and layer thicknesses. OPOD photosensitive materials are chosen for their absorption properties while photoluminescent materials for OLEDs are chosen for their emissive properties.

To produce internally generated electric fields that occupy a substantial volume, the usual method is to juxtapose two layers of material with appropriately selected conductive properties, especially with respect to their distribution of molecular quantum energy states. The interface of these two materials is called a photovoltaic hetero-junction. In traditional semiconductor theory, materials for forming PV hetero-junctions have been denoted as generally being of either n, or donor, type or p, or acceptor, type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photogenerated, majority carrier concentration depends primarily on unintentional doping by defects or impurities. The type and concentration of impurities determine the value of the Fermi energy, or level, within the gap between the highest occupied molecular orbital (HOMO) and the lowest unoccupied molecular orbital (LUMO), called the HOMO-LUMO gap. The Fermi energy characterizes the statistical occupation of molecular quantum energy states denoted by the value of energy for which the probability of occupation is equal to ½. A Fermi energy near the LUMO energy indicates that electrons are the predominant carriers. A Fermi energy near the HOMO energy indicates that holes are the predominant carrier. Accordingly, the Fermi energy is a primary characterizing property of traditional semiconductors and the prototypical PV hetero-junction has traditionally been the p-n interface.

In addition to relative free-carrier concentrations, a significant property in organic semiconductors is carrier mobility. Mobility measures the ease with which a charge carrier can move through a conducting material in response to an electric field. As opposed to free carrier concentrations, carrier mobility is determined in large part by intrinsic properties of the organic material such as crystal symmetry and periodicity. Appropriate symmetry and periodicity can produce higher quantum wavefunction overlap of HOMO levels producing higher hole mobility, or similarly, higher overlap of LUMO levels to produce higher electron mobility. Moreover, the donor or acceptor nature of an organic semiconductor, e.g., 3,4,9,10-perylenetetracarboxylic dianhydride (PTCDA), may be at odds with the higher carrier mobility. For example, while chemistry arguments suggest a donor, or n-type, character for PTCDA, experiments indicate that hole mobilities exceed electron mobilities by several orders of magnitude so that the hole mobility is a critical factor. The result is that numerous labels can be used to describe different aspects of an organic semiconductor layer. A layer may be simultaneously described as "p-type," "acceptor-type," and "hole-transporting-layer" (HTL) and the adjacent layer may be described as "n-type," "donor-type," and "electron-transporting-layer" (ETL). In this designation scheme, an ETL will preferentially be electron conducting and an HTL will preferentially be hole transporting. The term "rectifying" denotes, inter alia, that an interface has an asymmetric conduction characteristic, i.e., the interface supports electronic charge transport preferably in one direction. Rectification is associated normally with a built-in electric field that occurs at the hetero-junction between appropriately selected materials.

Organic PV devices typically have relatively low quantum yield (the ratio of photons absorbed to carrier pairs generated, or electromagnetic radiation to electricity conversion efficiency), being on the order of 1% or less. This is, in part, thought to be due to the second order nature of the intrinsic photoconductive process, that is, carrier generation requires exciton generation, diffusion and ionization, as described above. In order to increase these yields, materials and device configurations are desirable which can enhance the quantum yield and, therefore, the power conversion efficiency.

Particularly organic PV devices configurations that can be formed into OPSDs of current invention are described in U.S. Pat. No. 6,451,415, herein incorporated by reference. These devices can be configured to measure the lateral photoeffect and thereby determine incident beam position.

Lateral Photoeffect

The lateral photoeffect is a known phenomena that occurs when a non-uniform light source is incident onto a PV device. (J. T. Wallmark, "A new semiconductor photocell using lateral photoeffect," Proc. IRE, vol. 45, no. 4, pp. 474–483, April 1957.); S. Arimoto, H. Yamamoto, H. Ohno, and H. Hasegawa, "Hydrogenated amorphous silicon position sensitive detector," J. Appl. Phys., vol. 57, no. 10, pp. 4778–4782, May 1985; E. Fortunato, G. Lavareda, R. Martins, F. Soares, and L. Fernandes, "Large-area 1 D thin-film position-sensitive detector with high detection resolution," Sensor Actuat. A: Phys., vol. 51, no. 2–3, pp. 135–142, February 1996, each are herein incorporated by reference.)

When photons impinge onto a semiconductor junction, electron-hole pairs are generated on both sides of the junction. Carriers move down the potential gradient and set up a transverse photovoltage across the semiconductor junction. If, instead of illuminating the entire junction, a spot of light is shone on the junction, a lateral photovoltage is set up. Carriers flow parallel to the plane of the junction and between the irradiated and non-irradiated regions is created.

The linearity of the incremental change in the current with distance traveled along the electrode surface indicates the sensitivity of the device to the lateral photoeffect. Preferably, a device using the lateral photoeffect will have a substantially linear change in current. As used herein, the term "substantially" means within 10%, within 5%, within 2% or more particularly within 1%.

The lateral photovoltage is dependent on the net flow distribution of photoelectron carriers; this flow leads to the accumulation of an electric field along the hetero-junction between the donor and acceptor layer. As used herein, the term "lateral photovoltage" refers to a photovoltage measured parallel to the plane of the semiconductor junction.

A reverse bias may be used to inhibit the re-injection of carriers across the junction due to an increased potential barrier. This is the photodetector or photodiode mode of operation and may be used to enhance the response time and reduce the background illumination.

OPSDs

In an exemplary embodiment of the present invention depicted in FIG. 1, a position sensitive detector 100 is shown. The substrate, 101, may be any suitable substrate that provides desired structural properties. Substrate 101 may be flexible or rigid. Substrate 101 may be transparent, translucent or opaque. Plastic and glass are examples of preferred rigid substrate materials. Plastic and metal foils are examples of preferred flexible substrate materials. Substrate 101 may be a semiconductor material in order to facilitate the fabrication of circuitry. Other substrates may be used. The material and thickness of substrate 101 may be chosen to obtain desired structural and optical properties.

The resistive electrode, 102 may be any suitable electrode that is sufficiently conductive to transport holes to the organic layers. The resistive electrode 102 is preferably uniformly resistive across the electrode.

The material of resistive electrode 102 preferably has a work function higher than about 4 eV (a "high work function material"). Preferred resistive electrode materials include conductive metal oxides, such as indium tin oxide (ITO) and indium zinc oxide (IZO), aluminum zinc oxide (AlZnO), and metals. Resistive electrode (and substrate 101) may be sufficiently transparent to create a bottom-photoconductive device. A preferred transparent substrate and resistive electrode combination is commercially available ITO (electrode) deposited on glass or plastic (substrate). A flexible and transparent substrate-anode combination is disclosed in U.S. Pat. No. 5,844,363, which is incorporated by reference in its entirety. Resistive electrode 102 may be opaque and/or reflective. A reflective resistive electrode 102 may be preferred for some top-emitting devices, to increase the amount of light emitted from the top of the device. The material and thickness of resistive electrode 102 may be chosen to obtain desired conductive and optical properties. Where resistive electrode 102 is transparent, there may be a range of thickness for a particular material that is thick enough to provide the desired conductivity, yet thin enough to provide the desired degree of transparency. Other anode materials and structures may be used.

A polymer layer 103 is preferentially disposed above the resistive electrode 102. Preferred polymer material includes a film of 3,4-polyethylenedioxythiophene:poly-styrene-sulfonate (PEDOT:PSS). The polymer may cause a shift in the photocurrent characteristics because of the higher work function of the polymer in comparison with that of ITO, moving the Fermi-level up (about 0.50 V for PEDOT:PSS) and improving current injection into the donor layer. The application of and characteristics of the PEDOT:PSS layer are described in P. Peumans et al., herein incorporated by reference. (P. Peumans and S. R. Forrest, "Very-high-efficiency double-heterostructure copper phthalocyanine-/$C_{60}$ photovoltaic cells," Appl. Phys. Lett., vol. 79, no. 1, pp. 126–128, July 2001, herein incorporated by reference.)

The electrode contact 104 may be any suitable material or combination of materials known to the art, such that electrode contact 104 is capable of conducting electrons. Electrode contact 104 may be transparent or opaque, and may be reflective. Metals and metal oxides are examples of suitable electrode contact materials. The position sensitive detector 100 has at least two electrode contacts 104, which may be located on opposite ends of the device. Alternatively, the device may have 3, 4, 5, 6, 7, 8 or more electrode contacts.

The electrode contact 104 may be in direct physical contact with the resistive electrode 102 or may be separated from the resistive electrode 102 by a polymer layer 103. In either configuration, the electrode contact 104 will be in electrical contact with the resistive electrode 102.

A donor semiconductive organic layer 105, such as copper phthalocyanine (CuPc) is disposed above the polymer layer 103. This layer may also be described as a hole transport layer and is believed to have a LUMO-HOMO separation of approximately 1.7 eV. Adjacent to the donor layer 105 is an acceptor semiconductive organic layer 106 such as 3,4,9,10-perylenetetracarboxylic-bis-benzimidazole (PTCBI). This layer may also be described as an electron transport layer that is also is believed to have a LUMO-HOMO separation of approximately 1.7 eV. A hetero-junction 107 is located between the donor layer 105 and the acceptor layer 106. As used herein, the terms "acceptor" and "donor" are used interchangeably with the terms "acceptor-like" and "donor-like."

An exciton-blocking layer 108 such as a 2,9-dimethyl-4,7-diphenyl-1,10-phenanthroline (BCP) layer is disposed above the donor layer. BCP is believed to have a LUMO-HOMO separation of approximately 3.5 eV. The exciton-blocking layer allows for the confinement of photogenerated excitons to the region near the hetero-junction 107 and prevent parasitic exciton quenching at a photosensitive organic/electrode interface. In addition to limiting the volume over which excitons may diffuse, an exciton-blocking layer can also act as a diffusion barrier to substances introduced during deposition of the electrodes. In some circumstances, an EBL can be made thick enough to fill pinholes or shorting defects that could otherwise render an OPOD non-functional. An exciton-blocking layer can therefore help protect fragile organic layers from damage produced when electrodes are deposited onto the organic materials.

An electrode 109 is disposed above the exciton-blocking layer. The electrode 109 may be any suitable material or combination of materials known to the art, such that electrode 109 is capable of conducting electrons and injecting them into the organic layers of device 100. The electrode 109 may be transparent or opaque, and may be reflective. Metals and metal oxides are examples of suitable electrode materials. Electrode 109 may be a single layer, or may have a compound structure; preferred materials for a compound structure include ITO, IZO, and other materials known to the art. U.S. Pat. Nos. 5,703,436 and 5,707,745, which are incorporated by reference in their entireties, disclose examples of electrodes including compound electrodes having a thin layer of metal such as Mg:Ag with an overlying transparent, electrically-conductive, sputter-deposited ITO layer. The part of electrode 109 that is in contact with the underlying organic layer is preferably made of a material having a work function lower than about 4 eV (a "low work function material"). Other electrode materials and structures may be used.

Electrodes

The electrodes used in a photosensitive optoelectronic device are an important consideration. In a photosensitive optoelectronic device, it is desirable to allow the maximum amount of ambient electromagnetic radiation from the device exterior to be admitted to the photoconductively active interior region. That is, it is desirable to get the electromagnetic radiation to where it can be converted to electricity by photoconductive absorption. This often dictates that at least one of the electrical contacts should be minimally absorbing and minimally reflecting of the incident electromagnetic radiation. That is, such contact should be substantially transparent. When used herein, the terms "electrode" and "contact" refer to layers that provide a medium for delivering photogenerated power to an external circuit or providing a bias voltage to the device. That is, an electrode, or contact, provides the interface between the photoconductively active regions of an organic photosensitive optoelectronic device and a wire, lead, trace or other means for transporting the charge carriers to or from the external circuit. The term "charge transfer layer" is used herein to refer to layers similar to but different from electrodes in that a charge transfer layer delivers charge carriers from one subsection of an optoelectronic device to the adjacent subsection. As used herein, a layer of material or a sequence of several layers of different materials is said to be "transparent" when the layer or layers permit at least 50% of the ambient electromagnetic radiation in relevant wavelengths to be transmitted through the layer or layers. Similarly, layers that permit some but less that 50% transmission of ambient electromagnetic radiation in relevant wavelengths are said to be "semi-transparent".

Electrodes or contacts are usually metals or "metal substitutes." Herein the term "metal" is used to embrace both materials composed of an elementally pure metal, e.g., Ag and Mg, and also metal alloys which are materials composed of two or more elementally pure metals, e.g., Mg and Ag together, denoted Mg:Ag. Here, the term "metal substitute" refers to a material that is not a metal within the normal definition, but which has the metal-like properties that are desired in certain appropriate applications. Commonly used metal substitutes for electrodes and charge transfer layers would include doped wide bandgap semiconductors, for example, transparent conducting oxides such as indium tin oxide (ITO), gallium indium tin oxide (GITO), and zinc indium tin oxide (ZITO). In particular, ITO is a highly doped degenerate n+ semiconductor with an optical bandgap of approximately 3.2 eV rendering it transparent to wavelengths greater than approximately 3900 Å. Another suitable metal substitute material is the transparent conductive polymer polyanaline (PANI) and its chemical relatives. Metal substitutes may be further selected from a wide range of non-metallic materials, wherein the term "non-metallic" is meant to embrace a wide range of materials provided that the material is free of metal in its chemically uncombined form. When a metal is present in its chemically uncombined form, either alone or in combination with one or more other metals as an alloy, the metal may alternatively be referred to as being present in its metallic form or as being a "free metal". Thus, the metal substitute electrodes of the present invention may sometimes be referred to as "metal-free" wherein the term "metal-free" is expressly meant to embrace a material free of metal in its chemically uncombined form. Free metals typically have a form of metallic bonding that may be thought of as a type of chemical bonding that results from a sea of valence electrons which are free to move in an electronic conduction band throughout the metal lattice. While metal substitutes may contain metal constituents they are "non-metallic" on several bases. They are not pure free-metals nor are they alloys of free-metals. When metals are present in their metallic form, the electronic conduction band tends to provide, among other metallic properties, a high electrical conductivity as well as a high reflectivity for optical radiation.

The term "electrode" refers to both cathodes and anodes. The two electrodes may be interchanged in the devices described herein to create a PSD having current flow in the opposite direction. Herein, the term "cathode" is used in the following manner. In PV device under ambient irradiation and connected with a resistive load and with no externally applied voltage, e.g., a solar cell, electrons move to the cathode from the adjacent photoconducting material. Similarly, the term "anode" is used herein such that in a cell under illumination, holes move to the anode from the adjacent photoconducting material, which is equivalent to electrons moving in the opposite manner. It will be noted that as the terms are used herein anodes and cathodes may be electrodes or charge transfer layers.

The term "resistive electrode" refers to either a cathode or an anode that has a resistance per unit of area of preferably at least 5 Ω/square. More particularly, the resistivity of the resistive electrode is preferably 10 Ω/square, 100 Ω/square, 1 KΩ/square or a resistivity up to 10 KΩ/square. The resistance per unit area of the resistive electrode should be uniform across the electrode to reduce errors in the calculation of position. Preferably, the resistivity should not vary more than 15%, or more preferably no more than 10% or 5% over the length of the resistive electrode.

The resistive electrode will have at least two contacts at different points on the electrode. These contacts may be dots or they may consist of a linear contact extending partially or substantially across one dimension of the resistive electrode. As used herein, the term "point" when referring to positions on an electrode may a single point a larger circular area, rectangular area, or other area.

In a one-dimensional device, these contacts are preferentially at the opposite ends of the electrode to allow for measurements of beam position at any place between them. The current measured at each of these contacts can be designated as either $I_1$ and $I_2$, or $I_{x-}$ and $I_{x+}$. This configuration can be seen in FIG. 1 and FIG. 2A. In an alternative embodiment, the resistive electrode will have additional contacts to form a two dimensional device that will provide optical beam position information in two dimensions. To form a two dimensional device 3, 4, or more electrical contacts will be connected to the resistive electrode and currents from each of the contacts will be measured to provide position information in two dimensions. The current measured at each of these contacts can be designated as $I_{y-}$, $I_{y+}$, $I_{x-}$, and $I_{x+}$. A schematic of one possible configuration for a two dimensional device is shown in FIG. 2B where the electrodes contacts are positioned along each of the four sides of the resistive electrode.

The configurations for two-dimensional electrodes, such as those described for silicon-based positional detectors, can be used with the OPSD. There are three general types of two-dimensional PSDs known for use in silicon-based PSDs. The Wallmark-type PSD has one resistive layer and four dot electrodes located so as to form a square or rectangle. The tetralateral-type PSD has four extended lateral electrodes instead of dot electrodes; this may be regarded as an improved version of the Wallmark-type PSD. The third general type of two dimensional PSD that may be used in current invention is a dual-axis duolateral PSD which has a pair of resistive layers disposed laterally and two parallel extended lateral electrodes at opposite sides on each layer. These resistive layers function as dividers of the generated photocurrent and provide more accurate light position detection than the tetralateral-type PSD. Two-dimensional electrodes are described in detail by S. Arimoto, H. Yamamoto, H. Ohno, and H. Hasegawa, in "Hydrogenated amorphous silicon position sensitive detector," J. Appl. Phys., vol. 57, no. 10, pp. 4778–4782, May 1985 and at usa.hamamatsu.com/hcpdf/catsandguides/psd.pdf, both of which are herein incorporated by reference.) It is therefore contemplated that the OPSD of the current invention will have at least a second resistive electrode that is parallel to the first resistive electrode to form a tetralateral-type OPSD.

Exciton Blocking Layer

The PSD as described herein may optionally include one or more exciton blocking layers (EBL). The theory and use of exciton blocking layers is described in more detail in U.S. Pat. No. 6,097,147 and U.S. patent application Ser. No. 10/173,682 to Forrest et al., which are incorporated by reference in their entireties. Blocking layers can serve one or more blocking functions. Although a blocking layer can include compounds that are capable of emitting, emission can occur in a separate emissive layer. Thus, in preferred embodiments, the blocking layer does not luminesce. Blocking layers can be thinner than carrier layers. Typical blocking layers have a thickness ranging from about 50 Å. Exciton-blocking layers have been described previously to confine excitons to the emission layer in an organic light emitting device (OLED) in order to increase the device efficiency. (Thompson et al. U.S. patent application Ser. No. 09/311,126, now abandoned, "Very High Efficiency Organic Light Emitting Devices Based on Electrophosphorescence" which is herein incorporated by reference). In the context of the present invention, an EBL is characterized by its ability to prevent the diffusion of excitons from an adjacent organic layer into or across the EBL. Forrest et al. And Arbour et al. disclose that alternating thin multilayer stacks of similar type photoconductors could be used to enhance photogenerated carrier collection efficiency over that using a single layer structure. (Forrest "Ultrathin Organic Films Growth by Organic Molecular Beam Deposition and Related Techniques", Chemical Reviews, Vol. 97, No. 6; Arbour, C., Armstrong, N. R., Brina, R., Collins, G., Collins, G., Danziger, J.-P., Lee, P., Nebesny, K. W., Pankow, J., Waite, S., "Surface Chemisties and Photoelectrochemistries of Thin Film Molecular Semiconductor Material", Molecular Crystals and Liquid Crystals, 1990, 183, 307, each of which are herein incorporated by reference.) Further, these sources describe multiple quantum well (MQW) structures in which quantum size effects occur when the layer thicknesses become comparable to the exciton dimensions.

Organic Layers

At least one semiconductive organic layer in the OPSD of the current invention is capable of absorbing light. Alternatively, both the donor layer and the acceptor layer may absorb light. This could be advantageous to increase the overall quantum efficiency and to provide an OPSD that is effective over a broader range of incident wavelengths.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

Where a first layer is described as "disposed near" a second layer, the first layer is disposed above, below, or next to the second layer. There may be other layers between the first and second layer, unless it is specified that the first layer is "in physical contact with" or "adjacent to" the second layer. The distance between the two layers is determined by the dimensions of the organic layer or layers that separate them. For example, an organic layer may be described as "disposed near" an electrode, even though there are various organic layers in between. When a first layer is described as "disposed between" two other layers, the first layer is placed between the two other layers. There may be additional layers between the first layer and either or both of the two other layers. When a first layer is described as "adjacent" to the second layer, the first and second layers are in contact with each other. The area of contact between the two organic layers is called the hetero-junction, and may be any hetero-junction known in the art for photovoltaic devices. A planar hetero-junction is a hetero-junction in which the interface between the two organic layers forms a plane.

The organic layers are generally comprised of materials that are capable of a charge transport function. CuPc is an example of a material that may be used as a donor layer from an ITO electrode and other electrodes. PTCBI is an example of a material that may be used as an acceptor or donor layer into an electron transport layer from an adjacent layer. Other materials or combinations of materials may be used for injection layers. Depending upon the configuration of a particular device, the organic layers may be disposed at locations different than those shown in FIG. 1. More examples of organic layers are provided in U.S. patent application Ser. No. 09/931,948 to Lu et al., which is incorporated by reference in its entirety. A donor layer may comprise a solution deposited material, such as a spin-coated polymer, e.g., PEDOT:PSS, or it may be a vapor deposited small molecule material, e.g., CuPc or MTDATA.

The acceptor semiconductive organic layer may planarize or wet the electrode surface so as to provide efficient hole injection from the electrode into the donor material. A acceptor layer may also have a charge carrying component having HOMO (Highest Occupied Molecular Orbital) energy levels that favorably match up, as defined by their herein-described relative ionization potential (IP) energies, with the adjacent electrode layer on one side of the acceptor and the donor layer on the opposite side of the acceptor. The "charge carrying component" is the material responsible for the HOMO that actually transports holes. This component may be the base material of the acceptor, or it may be a dopant. Using a doped acceptor allows the dopant to be selected for its electrical properties, and the host to be selected for morphological properties such as wetting, flexibility, toughness, etc. Preferred properties for the acceptor material are such that holes can be efficiently injected from the anode into the acceptor material. In particular, the charge carrying component of the acceptor preferably has an IP not more than about 0.7 eV greater that the IP of the anode material. More preferably, the charge-carrying component has an IP not more than about 0.5 eV greater than the anode material. Similar considerations apply to any layer into which holes are being injected. Acceptor materials are further distinguished from conventional hole transporting materials that are typically used in the hole transporting layer of an OLED in that such acceptor materials may have a hole conductivity that is substantially less than the hole conductivity of conventional hole transporting materials. The thickness of the acceptor of the present invention may be thick enough to help planarize or wet the surface of the anode layer. For example, an acceptor thickness of as little as 10 nm may be acceptable for a very smooth anode surface. However, since anode surfaces tend to be very rough, a thickness for the acceptor of up to 50 nm may be desired in some cases.

A protective layer may be used to protect underlying layers during subsequent fabrication processes. For example, the processes used to fabricate metal or metal oxide top electrodes may damage organic layers, and a protective layer may be used to reduce or eliminate such damage. Preferably, a protective layer has a high carrier mobility for the type of carrier that it transports, such that it does not significantly increase the operating voltage of the OPSD. CuPc, BCP, and various metal phthalocyanines are examples of materials that may be used in protective layers. Other materials or combinations of materials may be used. The thickness of protective layer is preferably thick enough that there is little or no damage to underlying layers due to fabrication processes that occur after organic protective layer is deposited. A more detailed description of protective layers may be found in U.S. patent application Ser. No. 09/931,948 to Lu et al., which is incorporated by reference in its entirety.

Structures and materials not specifically described may also be used, such as OPSDs comprised of polymeric materials such as disclosed in U.S. Pat. No. 5,247,190, Friend et al., which is incorporated by reference in its entirety. By way of further example, OPSDs having a single organic layer may be used. OPSDs may be stacked so as to have several hetero-junctions, for example as described in U.S. Pat. No. 5,707,745 to Forrest et al, which is incorporated by reference in its entirety.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 and U.S. patent application Ser. No. 10/054,586 to Forrest et al., which are incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3–20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Position Determination

Figure 3:
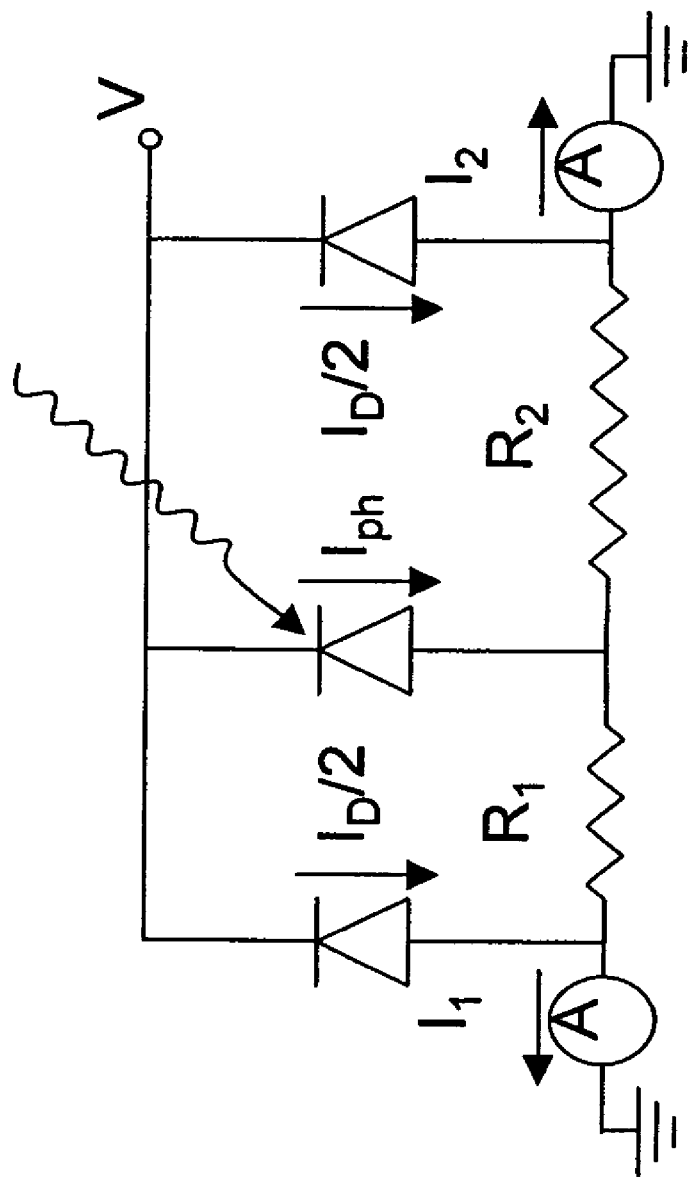
FIG. 3 is an electrical circuit equivalent to the OPSD of the current invention.

Light incident on the OPSD generates an exciton that subsequently drifts to the hetero-junction between organic donor- and acceptor-like molecular layers. At this interface, the exciton dissociates into a free electron and hole that are then collected as a photocurrent, $I_{ph}$, at the opposing electrodes, which are exemplified in FIG. 1 as ITO and Ag electrodes. This current is divided as a result of the finite resistance of the ITO layer (20 Ω/square). An equivalent circuit of the OPSD is shown in FIG. 3.

For a one-dimensional OPSD, since the detector is uniform along its length, the total dark current for the device, $I_D$, splits equally to either end of the OPSD. The currents $I_1$ and $I_2$ observed at the first and second electrode contacts, respectively, are $$I_1 = \frac{I_D}{2} + I_{ph}\left(\frac{R_2}{R_1 + R_2}\right) \text{ and } I_2 = \frac{I_D}{2} + I_{ph}\left(\frac{R_1}{R_1 + R_2}\right),$$

where $R_1$ and $R_2$ are the linear resistances of the ITO strip from the incident light beam position to the external anode contacts (FIG. 1). From the current $I_1$ and $I_2$ at either side of the device, the position, $\Delta_x$, of the incident beam from the center of the OPSD is $$\Delta x = \frac{I_1 - I_2}{2(I_1 + I_2)} L,$$

where L is the total device length, if $I_D \ll I_{ph}$. The device can be operated in either the "photovoltaic mode" (0 V applied between anode and cathode) or in the reverse biased "photodetector mode." Results for both modes of operation are reported in the Example hereinbelow.

For an OPSD having three electrode contacts, the analysis is similar. The total dark current will spit evenly into the different contact points, and the current observed at the three electrodes can be used to triangulate and find the position, $O_x$, of the incident beam. For an OPSD, the current from the four electrodes can be used to determine the position in both two dimensions.

It is understood that the various embodiments described herein are by way of example only, and are not intended to limit the scope of the invention. For example, many of the electrode and organic layer materials and structures described herein may be substituted with other electrode and organic layer materials and structures without deviating from the spirit of the invention. It is understood that various theories as to why the invention works are not indended to be limiting. For example, theories relating to charge transfer are not intended to be limiting.

EXAMPLES

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

Example 1—OPSD Fabrication

An OPSD was fabricated on precleaned glass substrates commercially precoated with a 1500 Å-thick ITO anode obtained from Applied Films Corporation in Longmont Colo. P. E. Burrows, Z. Shen, V. Bulovic, D. M. McCarty, S. R. Forrest, J. A. Cronin, and M. E. Thompson, "Relationship between electroluminescence and current transport in organic hetero-junction light-emitting devices," J. Appl. Phys., vol. 79, no. 10, pp. 7991–8006, May 1996.) A single photolithographic step was used to pattern and etch the ITO (in 5% $HNO_3$: 45% HCl: 50% $H_2O$ by volume at 70° C. for 5 min) into a 3 cm×1 mm line. The ITO was then spin-coated with a 300 Å-thick film of 3,4-polyethylenedioxythiophene: polystyrenesulfonate (PEDOT:PSS), followed by drying at 120° C. for 15 min in vacuum. The PEDOT:PSS layer improves current injection into the donor-like copper phthalocyanine (CuPc) layer by lowering the Fermi-level, and hence reducing the energy barrier to holes by 0.5 eV with the highest occupied molecular orbital of CuPc. (P. Peumans et al. Appl. Phys. Lett., vol. 79, no. 1, pp. 126). The polymer also serves to planarize the ITO, thereby preventing shorts through the thin donor and acceptor layers; a concern for large area devices. Subsequently, the small molecular weight films comprising the organic double heterostructure were deposited by thermal evaporation at room temperature in high vacuum (~$1 \times 10^{-6}$ Torr) in the following order: a 500 Å-thick film of the preferentially hole transporting CuPc, followed by 500 Å of the electron transporting, acceptor-like 3,4,9,10-perylenetetracarboxylic bis-benzimidazole (PTCBI). Next, a 100 Å-thick film of bathocuproine (BCP) was deposited. The BCP acts as an exciton-blocking layer, preventing recombination at the cathode/organic interface while also decreasing dark current and preventing damage to the PTCBI layer during metal deposition. (P. Peumans, V. Bulovic, and S. R. Forrest, "Efficient, high-bandwidth organic multilayer photodetectors," Appl. Phys. Lett., vol. 76, no. 26, pp. 3855–3857, June 2000.) Finally, an 800 Å-thick Ag layer was deposited through a shadow mask as the device cathode.

Example 2—Determining the Electronic and Optical Characteristics of the OPSD

Figure 4:
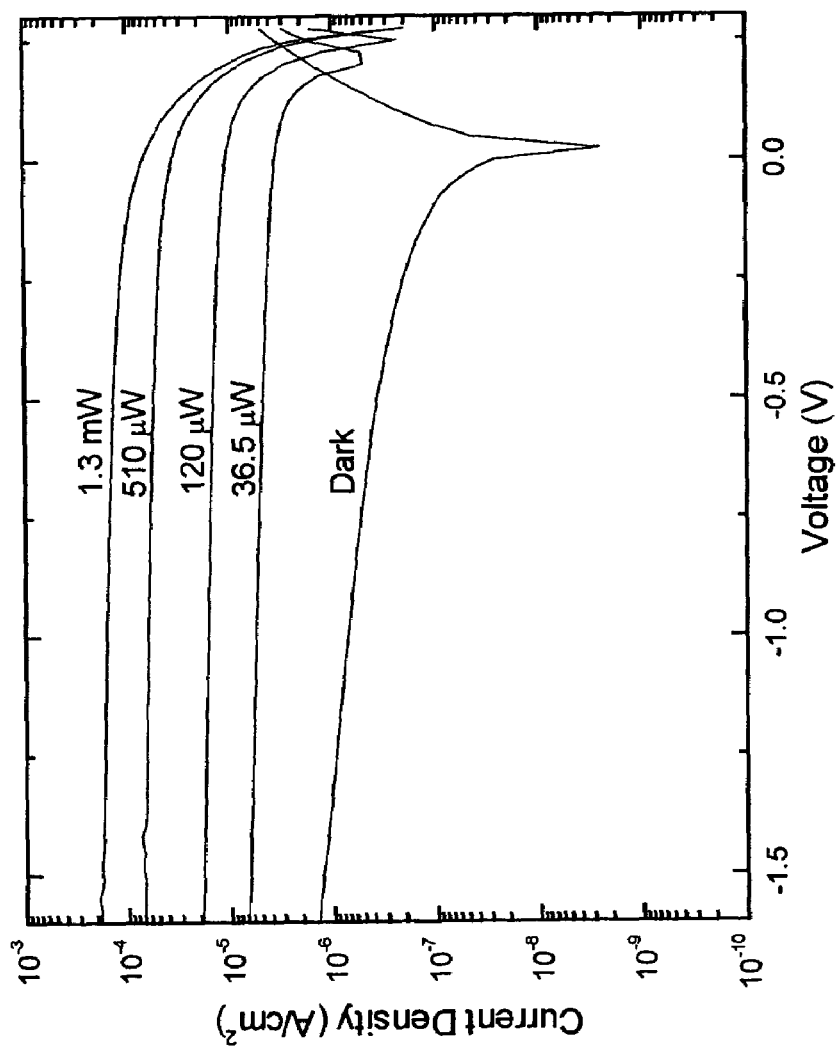
FIG. 4 depicts the current density versus voltage characteristics for the organic position sensitive detector in the dark and for different optical powers. Optical excitation is at $\lambda$=632.8 nm. Note that under illumination, a photovoltaic effect is clearly observed by the current reversal (indicated by the sharp dip in the current on the log scale) moving to ~+0.5 V.

FIG. 4 shows the current density-versus-voltage characteristics for the OPSD in the dark and under different intensities at a wavelength of $\lambda=632.8$ nm using a HeNe laser. The signal-to-background ratio (SBR) can be defined as $I_{ph}/I_D$, where $I_{ph}$ is the photocurrent and $I_D$ is the dark current of the device. A minimum SBR of 9 satisfies the condition $I_D \ll I_{ph}$ such that the OPSD response is linear and thus leads to an accurate determination of $\Delta x$. In particularly preferred embodiments, SBRs>1000 are achieved at low reverse bias for optical powers>500 $\mu$W.

Figure 5:
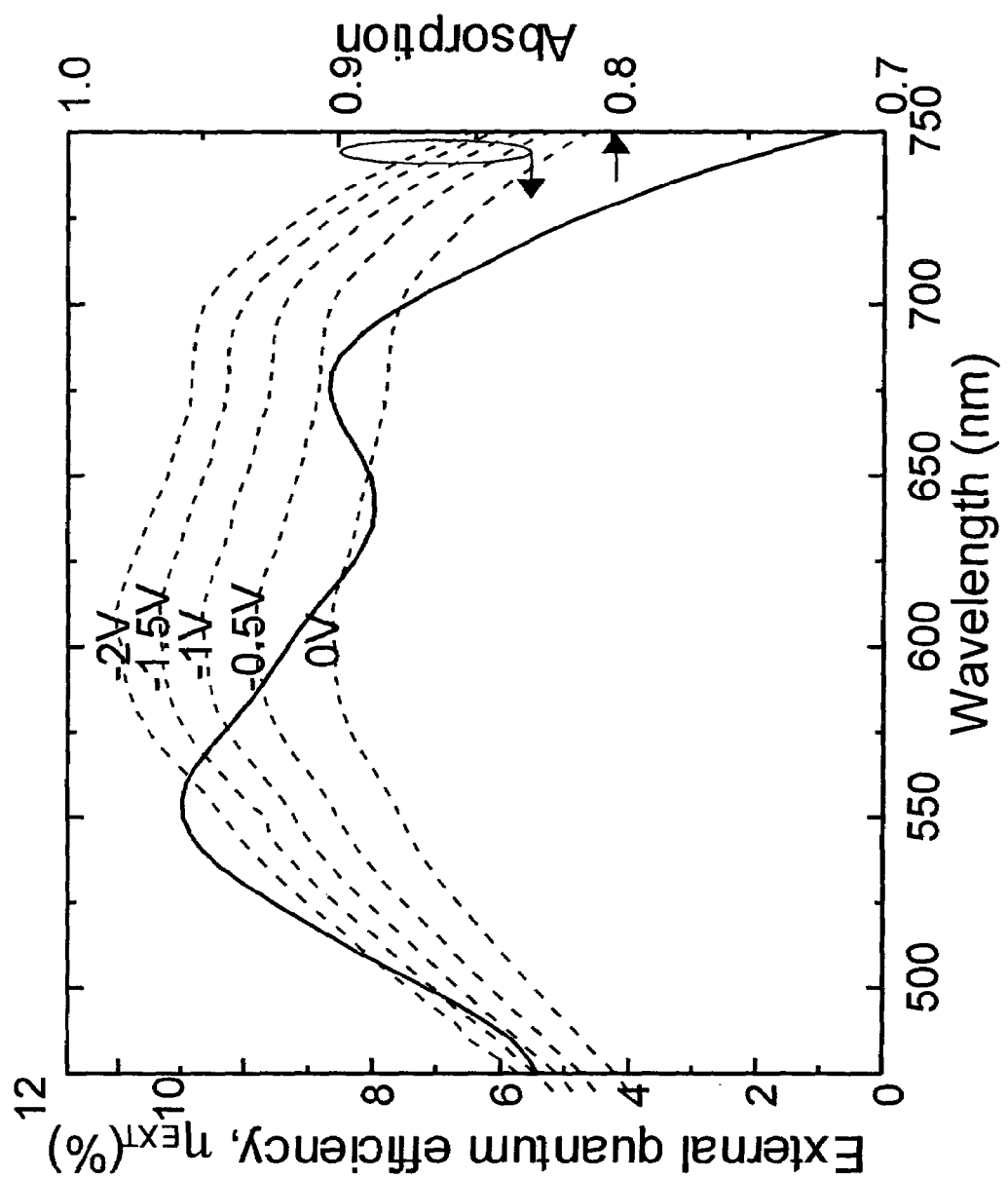
FIG. 5 shows the photoresponse of a position sensitive detector. Absorption (solid line) and external quantum efficiency for different reverse biases (dashed lines) are given for the OPSD as a function of wavelength.
Figure 6:
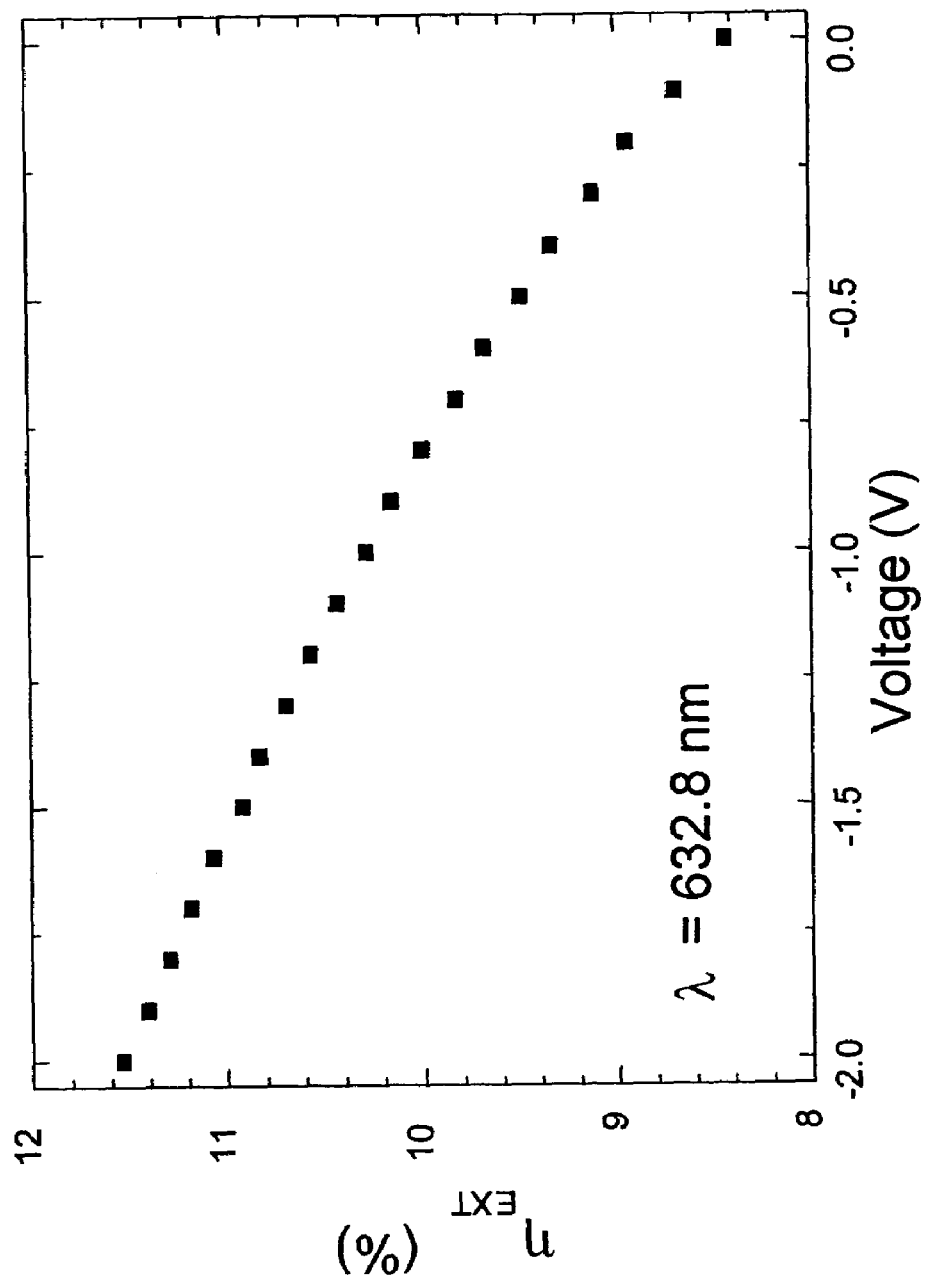
FIG. 6 provides external quantum efficiency at $\lambda$=632.8 nm versus voltage.

The absorption (solid line) and external quantum efficiencies ($\eta_{EXT}$) for different applied voltages (dashed lines) are shown in FIG. 5. The absorption has three peaks at $\lambda=550$, 610, and 680 rim. The $\lambda=550$ nm peak is due to the PTCBI layer while CuPc is responsible for the shoulder at $\lambda=610$ nm and the peak at $\lambda=680$ nm. Note that $\eta_{EXT}$ differs from the absorption spectrum since the diffusion length, $L_D$, of an exciton in PTCBI (30±10 Å) is much smaller than that in CuPc (100±30 Å). (P. Peumans et al. Appl. Phys. Lett., 79:1 126; P. Peumans, A. Yakimov, and S. R. Forrest, "Small molecular weight organic thin-film photodetectors and solar cells," J. Appl. Phys., vol. 93, no. 4, pp. February 2003.) To generate photocurrent, excitons must dissociate at the CuPc-PTCBI interface prior to carrier collection at the electrodes. Hence, only excitons generated within ~$L_D$ of the interface will contribute to $L_{ph}$. As a result, the photoresponse is greater for light absorbed in the CuPc layer than in PTCBI, as is apparent from FIG. 5. Also, $\eta_{EXT}$ at $\lambda=632.8$ nm is plotted versus reverse bias voltage for the photodetector in FIG. 6. As expected, $\eta_{EXT}$ increases with reverse bias as more photogenerated carriers are extracted due to field-induced dissociation of excitons. The values of $\eta_{EXT}$ are consistent with previous results for CuPc/PTCBI single donor/acceptor heterointerface detectors. (P. Peumans, V. Bulovic, and S. R. Forrest, "Efficient photon harvesting at high optical intensities in ultrathin organic double-heterostructure photovoltaic diodes," Appl. Phys. Lett., vol. 76, no. 19, pp. 2650–2652, May 2000, herein incorporated by reference.)

Example 3—Accuracy of the OPSD

Figure 7:
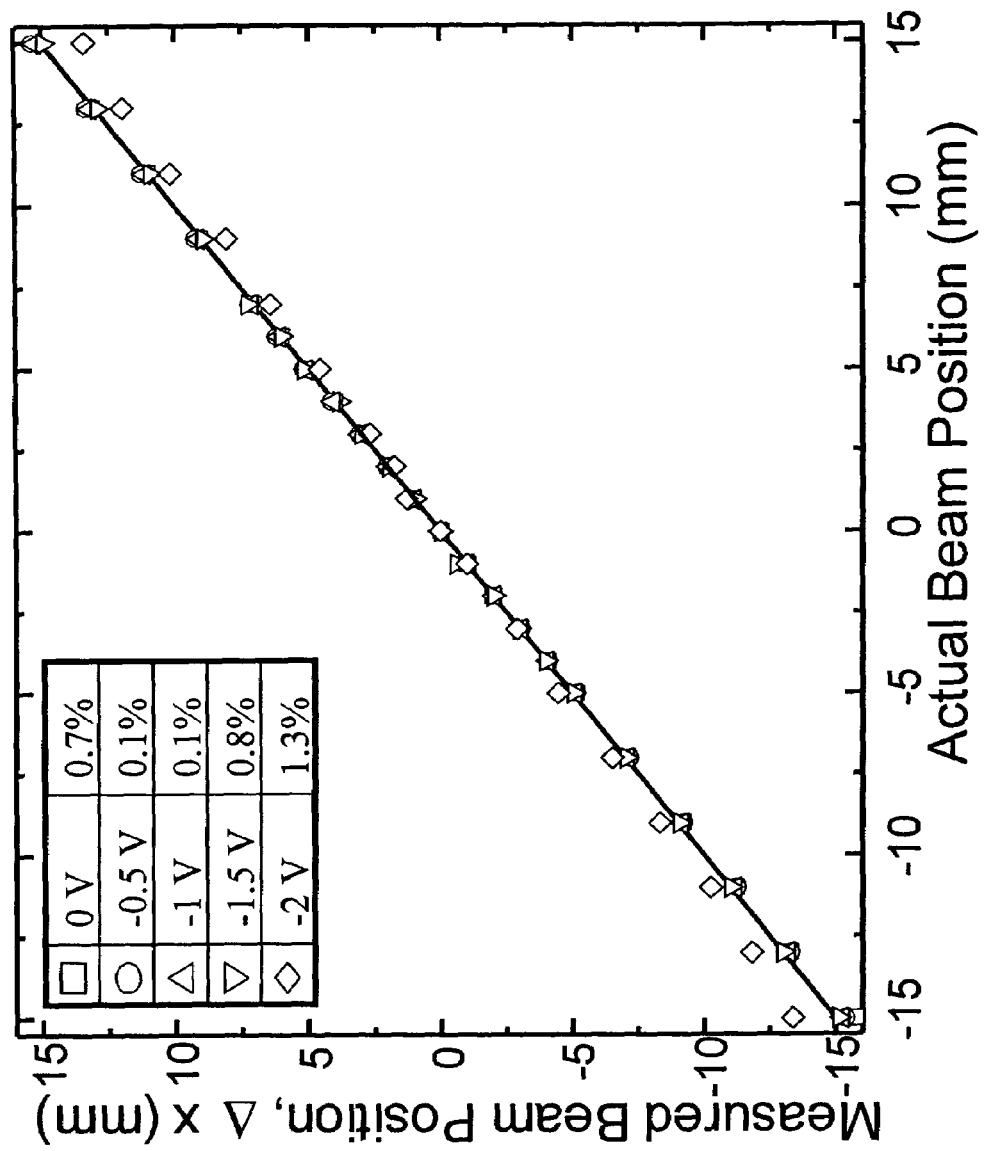
FIG. 7 shows position detection characteristics of the device of the current invention. Measurements versus actual beam position from the center of the OPSD, $\Delta$x, are given for 510 $\mu$W incident power under different bias conditions, using a beam diameter of 180 $\mu$m and $\lambda$=632.8 nm. Ideal linear response is also shown (solid line).

All 3 cm×1 mm OPSDs were scanned using a translation stage accurate to less than 10 μm and an optical beam of diameter 180 μm. To characterize beam tracking accuracy, the nonlinearity factor, δ=2σ/F was used, where σ is the root mean square deviation from a regression line fit to the measured position, and F is the full positional range of the data. Typically, δ<0.15 is sufficient for many applications. (E. Fortunato, G. Lavareda, R. Martins, F. Soares, and L. Fernandes, "Large-area 1 D thin-film position-sensitive detector with high detection resolution," Sensor Actuat. A: Phys., vol. 51, no. 2–3, pp. 135–142, February 1996.) Another important parameter for the OPSD is the measurement error, Σ=(ΔI/L), where Δl is the difference between the actual and calculated optical beam positions. (S. Arimoto, H. Yamamoto, H. Ohno, and H. Hasegawa, "Hydrogenated amorphous silicon position sensitive detector," J. Appl. Phys., vol. 57, no. 10, pp. 4778–4782, May 1985.) In FIG. 7, the response of the OPSD to a 510 μW beam is shown for different values of reverse bias ranging from 0 V to −2 V. Indeed, Δx is a linear function of the actual beam position, with δ=1.3% at −2 V, and δ<1% for all other applied voltages. The error of Σ=5% at −2 V is due to a decrease in SBR caused by an increase in dark current at high reverse voltage (see FIG. 4). All other voltages show a linear response with a maximum error <1% across the length of the OPSD.

FIG. 7 shows the response at an optical power of 510 μW. The value of δ at −1 V bias for different incidental optical powers include:

| Optical Power | Nonlinearity (δ) |
|---|---|
| 120 μW | 0.8% |
| 510 μW | 0.1% |
| 1.3 mW | 0.1% |

At all incident powers, both Σ and δ are <1%. As the power is decreased, the nonlinearity increases due to competition between the dark and the photocurrents. The minimum power required to operate the OPSD was approximately (20±10) μW, below which noise resulted in unacceptably high inaccuracies in measurement. At 1.3 mW, the nonlinearity was 0.11%, introducing a maximum positional error of <1%. The OPSD spatial resolution, defined as the minimum detectable beam displacement, was also measured. To determine the spatial resolution, scans were performed with a decreasing positional step size until δ exceeded 15%. This experiment resulted in a spatial resolution of r=20 μm, which is comparable to a-Si:H PSDs with resolutions from 10 to 50 μm. Nonlinearities below 20 μm are a result of error in measurement or nonuniformities along the length of the resistive ITO layer. (E. Fortunato, G. Lavareda, R. Martins, F. Soares, and L. Fernandes, "Large-area 1 D thin-film position-sensitive detector with high detection resolution," Sensor Actuat. A: Phys., vol. 51, no. 2–3, pp. 135–142, February 1996.)

Figure 8:
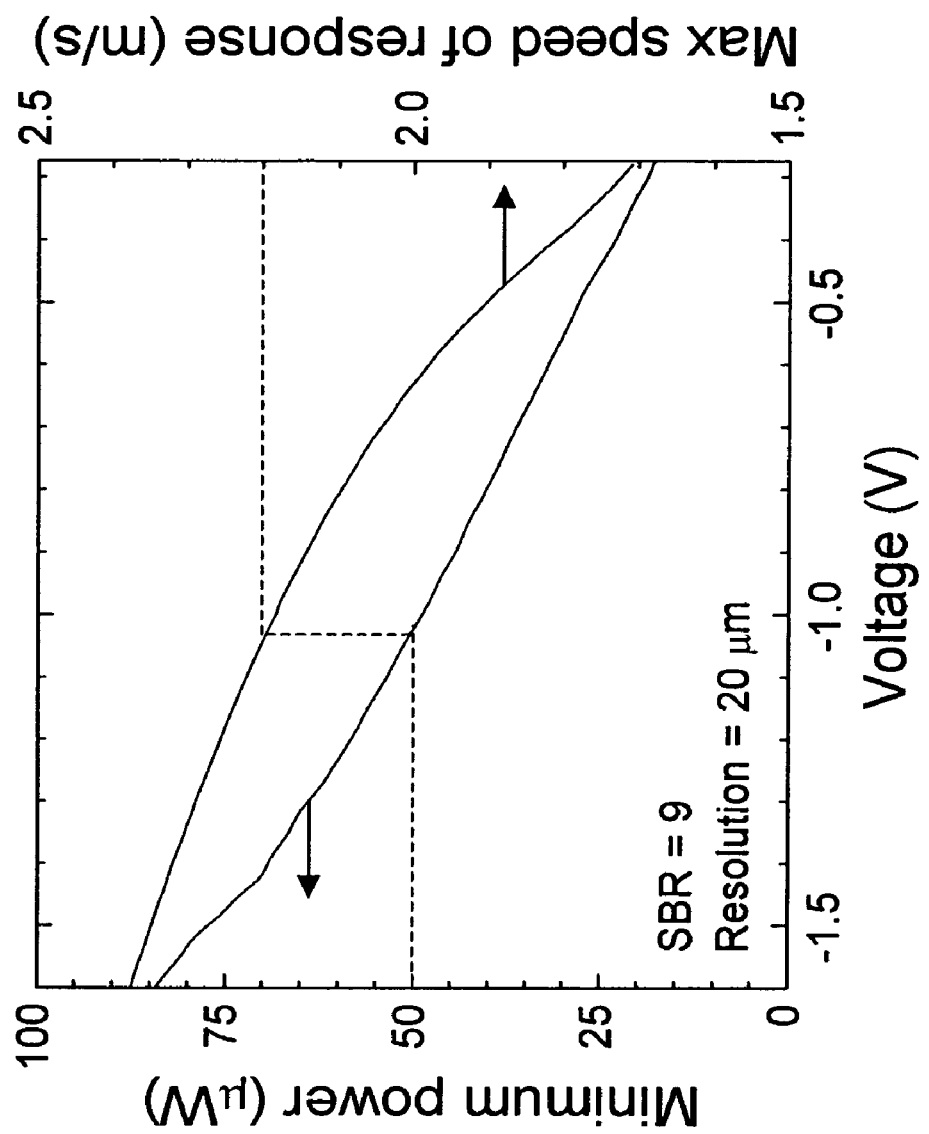
FIG. 8 shows minimum power and maximum beam tracking velocity versus voltage. A signal-to-background ratio SBR=9 and tracking resolution r=20 $\mu$m are assumed.

The speed of response of an OPSD can be defined as the maximum detectable scan velocity of an incident light beam across the detector active length. Typically, this is limited by the RC time constant (τ), where R is the total resistance of the ITO strip and C is the device capacitance. For the OPSD in FIG. 4, C=15.3 nF at −1 V bias and R=600 Ω, corresponding to τ=9.2 μs. To track a light spot at the highest possible resolution, the maximum scan speed a light spot can move is v=r/τ, or 2.2 m/s. FIG. 8 shows the relationship between the several device parameters: input optical power, speed of response, and voltage. The assumed operating conditions are SBR=9 and r=20 μm. The dashed line indicates that for an input power of 50 μW, a maximum speed of 2.2 m/s is obtained. Using this plot, one can also determine the minimum optical power needed to achieve high accuracy operation at a given speed of response.

We claim:

1. An organic position sensitive detector comprising:
   a first electrode, wherein the first electrode is resistive and has a first point and a second point;
   a first contact in electrical contact with the first point on the first electrode;
   a second contact in electrical contact with the second point on the first electrode;
   a second electrode disposed near the first electrode;
   a donor semiconductive organic layer disposed between the first electrode and the second electrode; and
   an acceptor semiconductive organic layer disposed between the first electrode and the second electrode and adjacent to the donor semiconductive organic layer,
   wherein a hetero-junction is located between the donor layer and the acceptor layer,
   and at least one of the donor layer and the acceptor layer is light absorbing; and wherein the detector further comprises at least one of
   a third contact, located at a third point on the resistive electrode; and
   a third electrode, wherein the third electrode is resistive and has a first point and a second point; a third contact in electrical contact with the first point on the third electrode; and a fourth contact in electrical contact with the second point on the third electrode, and wherein the third electrode is disposed near the first electrode.

2. The detector of claim 1, wherein the first electrode is an anode.

3. The detector of claim 1, wherein the first electrode is a cathode.

4. The detector of claim 1, wherein the first point and the second point are at opposite ends of the first electrode.

5. The detector of claim 5, further comprising a fourth contact, wherein the fourth contact is located at a fourth point on the resistive electrode.

6. The detector of claim 1, wherein the resistive electrode is 0.5–10 cm long and 0.01–5.0 cm wide.

7. The detector of claim 1, wherein the light absorbing layer has spectral sensitivity in the visible spectrum.

8. The detector of claim 1, wherein the resistive electrode has a resistivity of 5 Ω/square–10 KΩ/square.

9. The detector of claim 1, wherein the donor semiconductive organic layer comprises copper phthalocyanine (CuPc).

10. The detector of claim 1, wherein the acceptor semiconductive organic layer comprises 3,4,9,10-perylenetetracarboxylic bis-benzimidazole (PTCBI).

11. The detector of claim 1, further comprising an exciton blocking layer between the first electrode and the second electrode and adjacent to either the first electrode or the second electrode.

12. The detector of claim 11, wherein the exciton blocking layer comprises bathocuproine (BCP).

13. The detector of claim 12, wherein the BCP is doped with 3,4,9,10-perylenetetracarboxylic bis-benzimidazole (PTCBI).

14. The detector of claim 1, further comprising a polymer layer between the first electrode and the second electrode and adjacent to either the first electrode or the second electrode.

15. The detector of claim 13, wherein the polymer layer comprises 3,4-polyethylenedioxythiophene:polystyrene-sulfonate (PEDOT:PSS).

16. The detector of claim 15, wherein:
the donor semiconductive organic layer comprises copper phthalocyanine (CuPc);
the acceptor semiconductive organic layer comprises 3,4,9,10-perylenetetra-carboxylic-bis-benzimidazole (PTCBI);
the exciton blocking layer comprises 2,9-dimethyl-4,7-diphenyl-1,10-phenanthroline (BCP); and
the polymer layer comprises 3,4-polyethylenedioxythiophene:polystyrene-sulfonate (PEDOT:PSS).

17. The detector of claim 1, wherein the detector has an optical beam spatial resolution of less than 50 µm.

18. The detector of claim 17, wherein the detector has an optical beam spatial resolution of less than 20 µm.

19. An organic position sensitive detector comprising:
a first electrode, wherein the first electrode is resistive and has a first point and a second point;
a first contact in electrical contact with the first point on the first electrode;
a second contact in electrical contact with the second point on the first electrode;
a third contact, located at a third point on the resistive electrode;
a second electrode disposed near the first electrode; and
a semiconductive organic layer disposed between the first electrode and the second electrode, wherein the organic layer comprises at least one light absorbing material and wherein the detector is configured and adapted for measuring a lateral photovoltage.

20. The detector of claim 19, wherein the semiconductive organic layer comprises a donor layer and an acceptor layer and has a hetero-junction between the donor layer and the acceptor layer.

21. The detector of claim 19, wherein the first electrode is an anode.

22. The detector of claim 19, wherein the first electrode is a cathode.

23. The detector of claim 19, further comprising a fourth contact, wherein the fourth contact is located at a fourth point on the resistive electrode.

24. The detector of claim 19, wherein the resistive electrode has a resistance of 100 Ω–1000 Ω.

25. The detector of claim 19, wherein the donor semiconductive organic layer comprises copper phthalocyanine (CuPc).

26. The detector of claim 19, wherein the acceptor semiconductive organic layer comprises 3,4,9,10-perylenetetra-carboxylic bis-benzimidazole (PTCBI).

27. The detector of claim 19, further comprising an exciton blocking layer between the first electrode and the second electrode and adjacent to either the first electrode or the second electrode.

28. The detector of claim 27, wherein the exciton blocking layer comprises bathocuproine (BCP).

29. The detector of claim 28, wherein the BCP is doped with 3,4,9,10-perylenetetracarboxylic bis-benzimidazole (PTCBI).

30. The detector of claim 19, further comprising a polymer layer between the first electrode and the second electrode and adjacent to either the first electrode or the second electrode.

31. The detector of claim 30, wherein the polymer layer comprises 3,4-polyethylenedioxythiophene:polystyrene-sulfonate (PEDOT:PSS).

32. A method of determining the position of incident radiation comprising:
obtaining an organic position sensitive detector (PSD), wherein the PSD comprises:
a first electrode, wherein the first electrode is resistive and has a first point and a second point;
a first contact in electrical contact with the first point on the first electrode;
a second contact in electrical contact with the second point on the first electrode;
a second electrode disposed near the first electrode; and
a semiconductive organic layer disposed between the first electrode and the second electrode, wherein the organic layer comprises at least one light absorbing material,
placing the PSD in the path of the incident radiation; and
measuring a current at the first contact and a current at the second contact; and
wherein the currents are used to determine the position of the incident radiation.

33. The method of claim 32, wherein there is no voltage applied to the PSD.

34. The method of claim 32, further comprising applying a voltage of between 0.0 and −2.0 volts.

35. The method of claim 32, wherein the semiconductive organic layer comprises a donor layer and an acceptor layer and has a hetero junction between the donor layer and the acceptor layer.

36. The method of claim 32, further comprising measuring a current at a third contact and a current at a fourth contact, wherein the third contact and fourth contact are located on the resistive electrode.

37. The method of claim 32, wherein the detector response is substantially linear above 10 µW incident power.

38. The method of claim 32, wherein the beam tracking velocity is at least 1.0 m/s.

* * * * *